(12) United States Patent
Kelber

(10) Patent No.: US 9,748,340 B2
(45) Date of Patent: Aug. 29, 2017

(54) GRAPHENE FIELD EFFECT TRANSISTOR

(75) Inventor: Jeffry Kelber, Denton, TX (US)

(73) Assignee: QUANTUM DEVICES, LLC, Rockville, MD (US)

( * ) Notice: Subject to any disclaimer, the term of this patent is extended or adjusted under 35 U.S.C. 154(b) by 178 days.

(21) Appl. No.: 13/426,823

(22) Filed: Mar. 22, 2012

(65) Prior Publication Data

US 2013/0248824 A1    Sep. 26, 2013

(51) Int. Cl.
| | | |
|---|---|---|
| H01L 29/06 | (2006.01) | |
| H01L 29/08 | (2006.01) | |
| H01L 29/16 | (2006.01) | |
| H01L 29/778 | (2006.01) | |
| B82Y 10/00 | (2011.01) | |
| H01L 29/51 | (2006.01) | |
| B82Y 40/00 | (2011.01) | |

(52) U.S. Cl.
CPC .......... *H01L 29/1606* (2013.01); *B82Y 10/00* (2013.01); *H01L 29/778* (2013.01); *B82Y 40/00* (2013.01); *H01L 29/517* (2013.01)

(58) Field of Classification Search
CPC ... H01L 29/772; H01L 29/7839; H01L 29/78; H01L 21/02527; H01L 29/1606; H01L 21/02518; H01L 21/02521; H01L 21/02499
USPC ... 257/347, 24, 27, 192, 213, 256, 262, 288, 257/900, 902, 903; 438/FOR. 163, 151, 438/197, 198, 199, 135, 142
See application file for complete search history.

(56) References Cited

U.S. PATENT DOCUMENTS

| | | |
|---|---|---|
| 4,957,773 A | 9/1990 | Spencer et al. |
| 5,658,834 A | 8/1997 | Dowben |
| 6,025,611 A | 2/2000 | Dowben |
| 6,440,786 B1 | 8/2002 | Dowben |
| 6,600,177 B2 | 7/2003 | Dowben |
| 6,771,730 B1 | 8/2004 | Dowben et al. |
| 6,774,013 B2 | 8/2004 | Dowben et al. |
| 7,368,794 B2 | 5/2008 | Caruso et al. |
| 2011/0017979 A1* | 1/2011 | Meric et al. ............ 257/29 |
| 2011/0114918 A1* | 5/2011 | Lin et al. ............ 257/24 |
| 2011/0291068 A1* | 12/2011 | Kobayashi ............ 257/9 |
| 2012/0138903 A1* | 6/2012 | Chung et al. ............ 257/29 |
| 2012/0175595 A1* | 7/2012 | Chung et al. ............ 257/29 |
| 2013/0001515 A1* | 1/2013 | Li et al. ............ 257/24 |

(Continued)

OTHER PUBLICATIONS

Hong, et al., Integrating Functional Oxides and Graphene, Physical Review Letters 102, 136808 (2009).

(Continued)

*Primary Examiner* — Thanh Y Tran
(74) *Attorney, Agent, or Firm* — Steven B. Kelber

(57) ABSTRACT

Graphene FETs exhibit low power consumption and high switching rates taking advantage of the excellent mobility in graphene deposited on a rocksalt oxide (111) by chemical vapor deposition, plasma vapor deposition or molecular beam epitaxy. A source, drain and electrical contacts are formed on the graphene layer. These devices exhibit band gap phenomena on the order of greater than about 0.5 eV, easily high enough to serve as high speed low power logic devices. Integration of this construction technology, based on the successful deposition of few layer graphene on the rocksalt oxide (111) with SI CMOS is straightforward.

8 Claims, 3 Drawing Sheets

(56) References Cited

U.S. PATENT DOCUMENTS

2013/0001655 A1* 1/2013 Huang et al. ............... 257/256

OTHER PUBLICATIONS

Lin, et al., 100-GHz Transistors from Wafer-Scale Epitaxial Graphene, Science, vol. 327, Feb. 5, 2010.
Fanton, et al., Catalytic-Free Synthesis of High Mobility Graphene on Sapphire, The Pennsylvania State University, Univesity Park, PA, U.S.A.
Carlson, et al., Doping of Boron Carbides with Cobalt, Using Cobaltocene, Appl. PHys. A 89, 195-201 (2007).
Lee, et al., Direct Growth of Nongraphene on Glass and Postdeposition Size Control, Applied PHysics Letters 98, 183106 (2011).
Liu, et al., The Local Structure of Transition Metal Doped Semiconducting Boron Carbides, J. Phys. D: Appl. PHys. 43 (2010) 085403.
Liu, et al., A New Look at Boron Based Semiconductors, Europhysicsnews, vol. 41, No. 3 (2010).
Santana, et al., Alterning the Electronic Band STructure of Europium Oxide with Gadolinium Doping, Abstract.
Zhou, et al., Structure, Electronic, and Transport Properties of Transition Metal Intercalated Graphene and Graphene-Hexagonal-Boron-Nitride Bilayer, Abstract.
Dowben, et al., The Local Environment of CO in B5CHx, J. Appl. Phys. 103, 070125.
Kong, et al., Graphene/substrate Charge Transfer, Charactetized by Inverse Photoelectron Spectroscopy, J. Phys. Chem. C 2010, 114, 21618-21624 (2010).
Gaddam, et al., Direct Graphene Growth on MgO: Origin of the Band Gap, J. Phys.: Condens. Matter 23, No. 7 (Feb. 23, 2011).
Kelber, et al., Direct Graphene Growth on MgO(111) by PHysical VApor Deposition: Interfacial Chemistry and Band Gap Formation, Proc. of SPIE vol. 8100 (81000Y-1)(2011).
Zhou, et al., Direct Graphene Growth on Co3O4(111) by MOlecular Beam Epitaxy, J. Phys. Condens. Matter 24 (2012) 072201.
Goniakowski, et al., Microscopic Mechanisms of Stabilization of Polar Oxide Surfaces Transition Metals on the MgO(111) Surface, Physical Review B 66 085417 (2002).
Meyer, et al., Surface Structure of POlar Co3O4(111) Films Grown Epitaxially on Ir(100)-(1×1), J. Phys. Condens. Matter 20 (2008) 265011.
Chen, et al., Selective Growth of (100)-, (110)-, and (111)-Oriented MgO Films on Si(100) by Pulsed Laser Deposition, J. Appl. Phys., vol. .91, No. 9, May 1, 2002.
Sung, et al, Chemical Beam Deposition of MgO Films on Si Substrates Using Methylmagnesium tert-Butoxide, Chem. Mater: 2002, 14, 826-831.
Speck, et al., Atomic Layer Deposited Aluminium Oxide Films on Graphite and Graphene Studied by XPS and AFM, Abstract, Nov. 2, 2009.
Han, et al., Spin Transport in Graphite and Graphene Spin Valves, Proc. of SPIE, vol. 7298 739819 (2009).
U.S. Appl. No. 61/522,600, filed Aug. 9, 2011, Zhou, et al.
Luo, et al., Insights into the Local Electronic STructure of Semiconducting Boron Carbides in the Vicinity of . . . , Materials Science and Engineering B 175 (2010 1-8.

* cited by examiner

GRAPHENE FIELD EFFECT TRANSISTOR

BACKGROUND OF THE INVENTION

Field of the Invention

The subject matter of this patent application was developed without Federal or State funding. Although the inventor named herein is the beneficiary of support from various corporate organizations, and is employed by a University at which he works on subject matter including the development and characterization of materials formed by the direct growth of graphene on various substrates, no University time, compensation or apparatus was employed, involved or relied on in the development of the subject matter disclosed and claimed herein. Thus, this invention and the claims presented herein reflect work done by the inventor without funding or support on the development of field effect transistors formed by graphene deposition.

Background of the Technology

Graphene displays electronic properties, including high room temperature carrier mobilities, long carrier mean free paths,[1-3] polarizeability in proximity to a magnetic substrate[4] and long spin diffusion lengths[5] with exciting potential for charge or spin-based device applications. A critical step in practical device development, however, is the direct, controlled growth, by industrially feasible and scalable methods, of high quality single or few layer graphene films on dielectric substrates. Methods such as chemical or physical vapor deposition (CVD, PVD) or molecular beam epitaxy (MBE) are of interest, but must occur at growth temperatures allowing integration with Si CMOS or other device materials. Most reports, however, have involved graphene/substrate interfaces formed by one of two approaches: (a) physical transfer of graphene sheets—grown by CVD on metal substrates[6,7] or taken from HOPG;[1,2] or (b) the growth of graphene layers by high temperature evaporation of Si from SiC(0001).[8-10] The former method presents significant problems for practical device production, including formation of nanoscale interfacial electronic inhomogeneities.[11] The second method appears limited to SiC(0001) substrates. Recent reports of MBE graphene growth on SiC(0001)[12,13] are also limited to SiC substrates. The ability to grow single or few layer graphene on oxides or other dielectric substrates of choice would not only enhance graphene integration with Si CMOS, but also facilitate the development of novel multifunctional non-volatile devices[14,15] that exploit substrate functionality and graphene/substrate interactions.

SUMMARY OF THE INVENTION

This patent application describes a pathway to make faster, lower power field effect transistors using graphene deposited directly on a (111)-oriented oxide with the rocksalt structure. Previous studies[1-3] have shown that graphene grown directly on MgO(111) by free radical assisted chemical vapor deposition or by physical vapor deposition displays a band gap of ~0.5 eV-1 eV, suitable for logic device applications. See, U.S. patent application Ser. No. 12/980,763, incorporated herein-by-reference. Specifically, a single layer of graphene on MgO(111) displays XPS evidence of strong bonding to the oxide substrate[2,3]. The LEED data shows that this layer displays three-fold, (C3V) rather than six-fold symmetry, as shown in FIG. 1. DC transport data for this (first carbon) layer shows semiconducting behavior with an estimated band gap at room temperature of ~0.6 eV. This is corroborated by spectroscopic ellipsometry data showing the lack of a $\pi \to \pi^*$ resonance common to graphene/$SiO_2$ or graphene/$SiC^4$. Thus, the first layer of C(111) on MgO is NOT true graphene, in that the $\pi$ system has been significantly affected by substrate interactions and (probably) rehybridization of the carbon atoms to something like $sp^x$ where $2<x<3$.

Importantly, the evidence for C3V symmetry implies that the graphene/MgO interface is commensurate. If it were not commensurate, then the A sites and B sites on the graphene lattice would each sample an ensemble of substrate environments, yielding equivalent A site/B site average environments. In contrast, a commensurate interface would have A site carbon atoms (e.g.) on atop oxygen sites of the MgO substrate, and with B carbon sites over (e.g.) hollow sites on the substrate. Such a scheme is shown schematically in FIG. 2, and is consisted with the XPS and LEED data. Since the lattice O—O nearest neighbor distance for both MgO(111) and Co3O4(111) is 2.8-2.9 Å, vs. the graphene lattice constant of 2.46 Å, the commensurate nature of the graphene/MgO(111) surface indicates oxide and or C(111) reconstruction. It is known that MgO(111) and other rocksalt oxide (111) surfaces (e.g., NiO(111)) are unstable and prone to reconstruction, especially upon metallization[5].

The second layer of C(111) on MgO(111) appears to be graphene like, as indicated by the observation of $\pi/\pi^*$ and $\sigma/\sigma^*$ features in the photoemission/inverse photoemission 1, and this data also indicates a band gap of 0.5-1 eV, consistent with the first layer transport measurements. Thus, the second layer of C(111) on MgO should possess graphene-like properties but the first layer will not. Secondly, graphene on other (111) rocksalt oxide surfaces may also undergo similar interactions. However, graphene grown on (111) oxides which do not reconstruct and have a larger O—O nearest neighbor distance than 2.5 Å (e.g., Co3O4(111) 6 should be incommensurate, as observed for graphene grown by MBE on Co3O4(111) 4

Methods for the manufacture of FETs prepared by the deposition of thin films of graphene on rocksalt oxides that are compatible with CMOS integration are set forth. The resulting FETs are described by characteristics and applications. Importantly, the band gap phenomena observe are at values consistent with other materials designed to serve in logic devices.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE INVENTION

Figure 1:
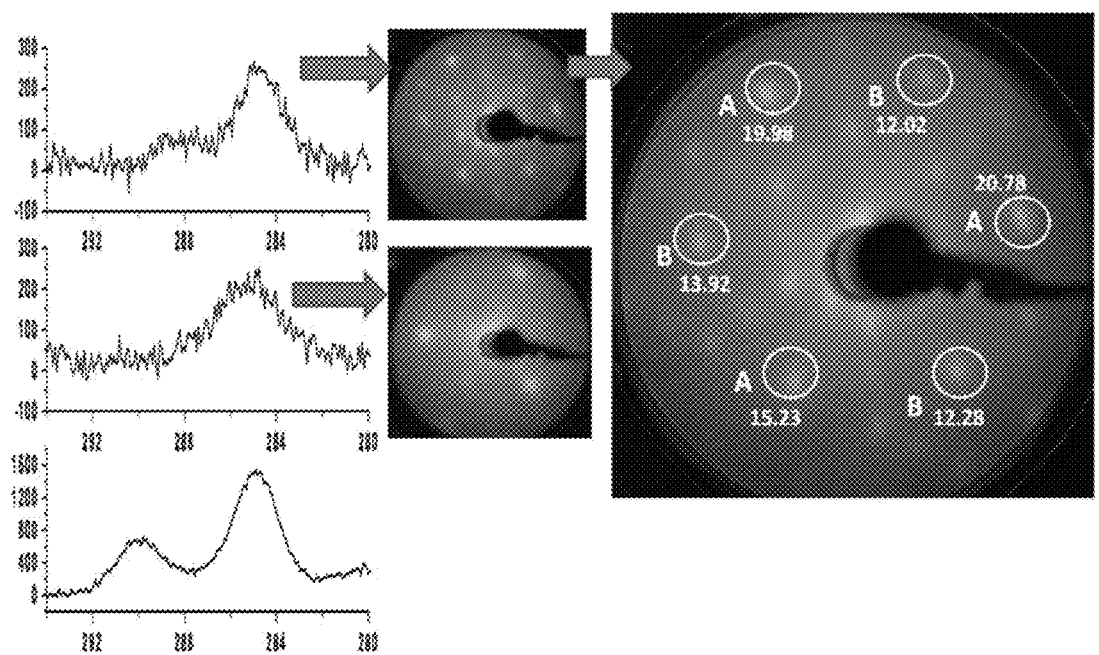
FIG. 1 reflects C(1s) and LEED spectra for formation of an ordered carbon monolayer on MgO (111). (a) XPS C(1s) spectrum of a multiplayer adventitious carbon film observed immediately after the insertion of the MgO crystal into UHV at room temperature (no LEED pattern is observed); (b) XPS C(1s) spectrum after annealing at 700 K in UHV in the presence of $O_2$; the XPS-derived average carbon layer thickness is 1 ML; (c) the corresponding LEED pattern exhibits C symmetry; (d) XPS after anneal of the film in (b) to 1000K in the presence of $C_2H_4$ ($5\times10^{-7}$ Torr, 25 min); the XPS derived C thickness remains 1 ML; (e) corresponding complex LEED pattern; (f) close-up of the pattern in (e) with integrated, background-subtracted intensities (arbitrary units) for 'A' and 'B' spots (circled). The A spots have an average intensity of 18.7±3, while the B spots have an average intensity of 12.9±1. The uncertainties are the standard deviations. Other spots in the image are weaker and are attributed to multiple diffraction. The LEED patterns were acquired at 80 eV beam energy. The XPS spectra binding energies are referenced to a MgO lattice oxygen O(1s) binding energy of 530.0 e[11].
Figure 2:
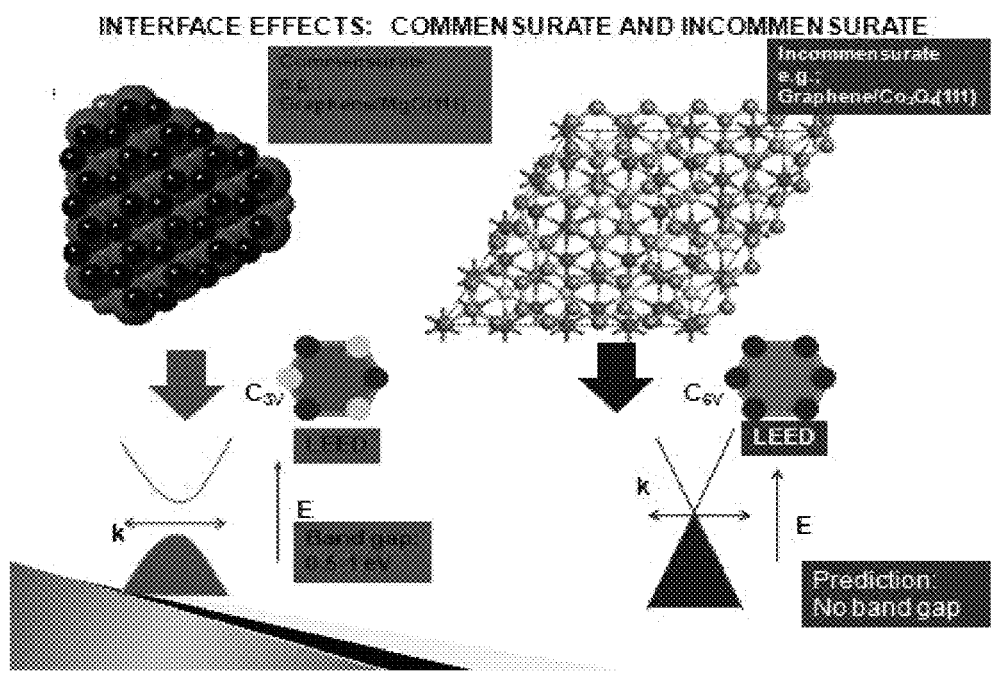
FIG. 2 is a schematic of a band gap formation due to (left) commensurate graphene/substrate interface lifting A site/B site chemical equivalence and therefore the HOMO/LUMO degeneracy at the Dirac point, consistent with C3V LEED symmetry. (Right) An incommensurate graphene interface results in graphene A and B sites sampling an ensemble of substrate interactions, and therefore retaining chemical equivalence, C6V LEED symmetry and therefore no band gap at the Dirac point.

The graphene based FETs of the invention are described herein below both in terms of the method of formation of the FETs and their resulting characteristics. Examples recited herein are not intended to be limiting unless those examples are reflected in the claims set forth below.

Construction of a Graphene/Rocksalt Oxide (111) FET—a Charge-Based Device—on Si(100) or Si(111)

Deposit a MgO(111) Film on Si(100) or on Si(111).

Formation of (100) textured MgO(111) on Si(100) by PLD has been reported[7] and by CVD[8]. The formation of (111) oxides on Si(111) may be easier, but the formation of (111) vs. (110) or (100) texture on Si(100) appears to be highly temperature-dependent. Other rocksalt (111) oxides of interest in this application, e.g., NiO(111) can be grown readily on Ni(111). Methods in the art report that NiO (111) can be grown directly on Si(100) and offer a different alternative for proceeding. In addition to magnesium and nickel oxides, other rock salt (110 films may be formed.

Graphene Growth on the MgO(111) or Other Oxide(111) Surface.

Previous studies indicate that CVD using thermally-cracked ethylene at ~600 K, followed by annealing in UHV to 1000 K, yields a 2-3 ML graphene surface[1]. In contrast, PVD at room temperature, followed by annealing in UHV at 1000 K yields a 1-2 ML graphene surface (first layer not really graphene, see above)[2,3]. Experience with other oxides (e.g., Co3O4(111)) suggests that MBE from a solid carbon source at 1000 K in UHV may yield controllable layer-by-layer growth. Current information suggests that the MBE method may be the preferred route for controlled growth. This is set forth, for example, in U.S. Provisional Patent Application Ser. No. 61/522,600, the entirety of which is incorporated herein by reference.

Deposition of Gate Oxide.

The gate oxide should form a non-chemically bonded (i.e., no metal carbide formation) interface with the graphene in order to maintain the graphene π network intact. Reports in the literature[9] suggest that ALD of alumina on graphene will give good results, but other possibilities including MgO[10] or HfO2[11] may also work. Highly energetic oxide deposition processes (e.g. PVD, PECVD) may disrupt the graphene π network. However, CVD and ALD are preferred.

Deposition of Source, Drain and Gate Contacts.

Metallization procedures will involve metal evaporation (e beam deposition, or possible PVD) to make source, drain and metal contacts. Good results[11] on physically transferred graphene sheets have been obtained using Cr/Au contacts. Recent experience suggests that Au may do as well (private communication). A schematic of the final structure is displayed in FIG. 3 wherein the substrate of Si is reference character 1000, the rocksalt oxide layer (e.g. NiO or MgO) is 1002, the graphene film is 1004, the top gate is indicated by 1006 and source and drain are 1008 and 1010, with gate contact 1012 provided on the top gate.

Figure 3:
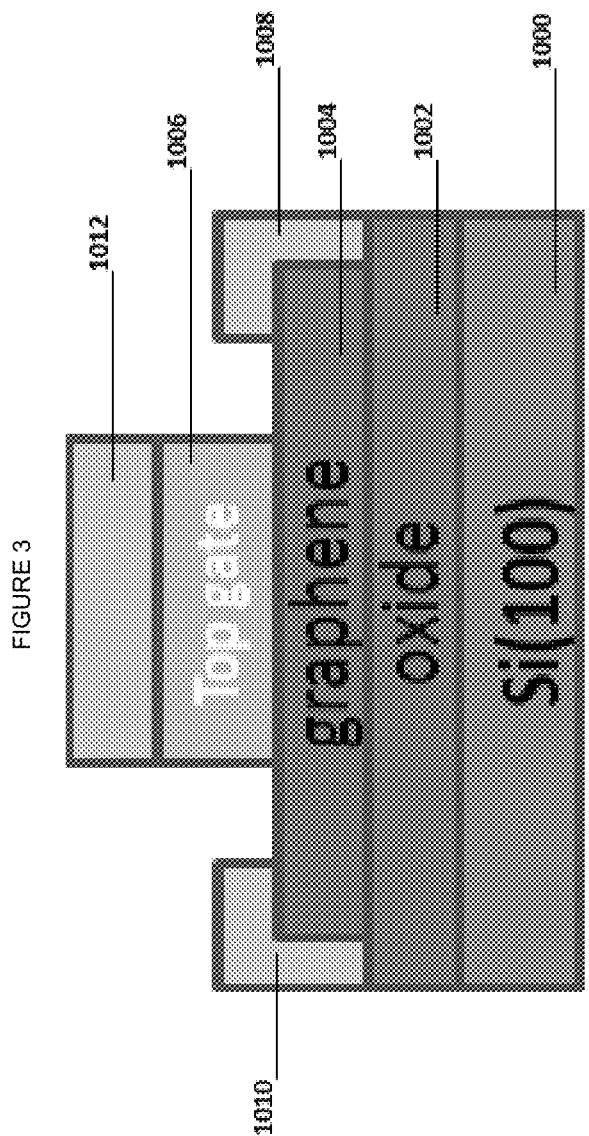
FIG. 3 is a schematic of a graphene-FET structure on Si(100).

The advantages of a device as in FIG. 3 relative to existing advanced Si CMOS include faster frequencies and lower operating power due to the superior mobility of graphene relative to Si. The presence of a band gap gives important advantages relative to devices made of graphene/SiC[12]. These devices may exhibit impressive operating frequencies, but undoubtedly have poor on/off ratios to small or non-existent band gaps for the graphene/SiC system.

In the device set forth in FIG. 3 the oxide can be MgO(111) or another (111)-oriented rocksalt structure oxide. The gate oxide could be alumina or hafnia, and the contacts could be Au or Cr/Au. In addition to Si(100) (as shown), Si(111) may be used.

REFERENCES

1. Lingmei Kong, Cameron Bjelkevig, Sneha Gaddam, Mi Zhou, Young Hee Lee, Gang He Han, Hae Kyung Jeong, Ning Wu, Zhengzheng Zhang, Jie Xiao, P. A. Dowben and Jeffry A. Kelber, J. Phys. Chem. C. 114, 21618 (2010).
2. Sneha Gaddam, Cameron Bjelkevig, Siping Ge, Keisuke Fukutani, Peter A. Dowben and Jeffry A. Kelber, J. Phys. Cond. Matt. 23, 072204 (2011).
3. J. A. Kelber, S. Gaddam, C. Vamala, S. Eswaran and P. A. Dowben, Proc. SPIE (in press), (2011).
4. M. Zhou, F. Pasquale, A. Boosalis, M. Schubert, P. A. Dowben and J. A. Kelber, in preparation
5. Jacek Goniakowski and Claudine Noguera, Physical Review B 66, 085417 (2002).
6. W. Meyer, K. Biedermann, M. Gubo, L. Hammer and K. Heinz, J. Phys.: Cond. Matt. 20, 265011 (2008).
7. X. Y. Chen, K. H. Wong, C. L. Mak, X. B. Yin, M. Wang, J. M. Liu and Z. G. Liu, J. Appl. Phys. 91, 5728 (2002).
8. Myung M. Sung, Chang G. Kim, Jinkwon Kim and Yunsoo Kim, Chem. Mater. 14, 826-31 (2002).
9. F. Speck, M. Rohrl Ostler J., K. V. Emtsev, M. Hundhausen, L. Ley and T. Seyller, Phys. Stat. Sol. (c) 7, 398 (2010).
10. Wei Han, K. Pi, H. Wang, M. McCreary, Yan Li, W. Bao, P. Wei, J. Shi, C. N. Laun and R. K. Kawakami, Proceedings of SPIE 7398, 739819-1 (2009).
11. X. Hong, A. Posadas, K. Zou, C. H. Ahn and J. Zhu, Physical Review Letters 102, 136808 (2009).
12. Y.-M Lin, C. Dimitrakopoulos, K. A. Jenkins, D. B. Farmer, H.-Y Chiu, A. Grill and Ph Avouris, Science 327, 662 (2010).

While the present invention has been disclosed with references to certain embodiments, numerous modification, alterations, and changes to the described embodiments are possible without departing from the sphere and scope of the present invention, as defined in the recited embodiments. Accordingly, it is intended that the present invention not be limited to the described embodiments, but that it has the full scope defined by the language of the description and equivalents thereof.

I claim as my invention:

1. A field effect transistor (FET) for high frequency low power applications comprising:

an Si(100) or Si (111) substrate, a layer of a rocksalt oxide (111), wherein said rocksalt oxide is MgO formed on the surface of said substrate, a film of 1-3 monolayer (ML) graphene formed on said rocksalt oxide through chemical vapor deposition (CVD), plasma vapor deposition (PVD) or molecular beam epitaxy (MBE), a source and a drain formed on said film of 1-3 ML graphene, a gate oxide on said graphene film, and electrical contacts for said source and drain.

2. The FET of claim 1 wherein said graphene is deposited by MBE.

3. The FET of claim 1 wherein said substrate is Si (111), and said source and drain and electrical contacts are comprised of Cr and Au.

4. The FET of claim 1, wherein said FET exhibits a bandgap of at least 0.5 eV.

5. A method of preparing a graphene-based FET, comprising forming a rocksalt oxide (111) layer of MgO on a substrate of Si (100) or Si (111), depositing a continuous film of 1-3 monolayers (ML) of graphene on said rocksalt oxide layer, forming a gate oxide and source and drain on said continuous film of 1-3 ML graphene and providing electrical contacts for said source and drain.

6. The method of claim 5, wherein said continuous graphene film of 1-3 ML is formed by CVD, PVD or MBE.

7. The method of claim 6, wherein said continuous graphene film of 1-3 ML is formed through MBE.

8. The method of claim 5, wherein said substrate is Si (111).

* * * * *